(12) United States Patent
King et al.

(10) Patent No.: US 8,900,761 B2
(45) Date of Patent: Dec. 2, 2014

(54) ZINC ANODE BATTERY WITH BORON NITRIDE COATED ZINC PARTICLES

(75) Inventors: David M. King, Longmont, CO (US); Dean S. Dinair, Boulder, CO (US)

(73) Assignee: The Regents of the University of Colorado, a body corporate, Boulder, CO (US)

(*) Notice: Subject to any disclaimer, the term of this patent is extended or adjusted under 35 U.S.C. 154(b) by 476 days.

(21) Appl. No.: 13/112,773

(22) Filed: May 20, 2011

(65) Prior Publication Data

US 2012/0045700 A1    Feb. 23, 2012

Related U.S. Application Data

(60) Provisional application No. 61/347,572, filed on May 24, 2010.

(51) Int. Cl.
```
H01M 4/42      (2006.01)
C23C 16/44     (2006.01)
H01M 4/04      (2006.01)
C23C 16/34     (2006.01)
H01M 10/24     (2006.01)
H01M 4/36      (2006.01)
C23C 16/455    (2006.01)
H01M 12/06     (2006.01)
```
(52) U.S. Cl.
CPC ............ *H01M 12/06* (2013.01); *Y02E 60/124* (2013.01); *H01M 4/42* (2013.01); *C23C 16/4417* (2013.01); *H01M 4/0402* (2013.01); *C23C 16/342* (2013.01); *H01M 10/24* (2013.01); *H01M 4/366* (2013.01); *C23C 16/45553* (2013.01)
USPC .......................................... 429/406; 429/229

(58) Field of Classification Search
CPC ..................... H01M 2300/0014; H01M 4/244
See application file for complete search history.

(56) References Cited

U.S. PATENT DOCUMENTS

| | | | |
|---|---|---|---|
| 2004/0115532 A1* | 6/2004 | Malservisi et al. | 429/229 |
| 2005/0008557 A1* | 1/2005 | Yadav et al. | 423/274 |
| 2005/0126338 A1* | 6/2005 | Yadav | 75/255 |
| 2011/0150792 A1* | 6/2011 | Shao et al. | 424/59 |

FOREIGN PATENT DOCUMENTS

TW          200841508 A    * 10/2008

* cited by examiner

*Primary Examiner* — Patrick Ryan
*Assistant Examiner* — Lucas J O Donnell
(74) *Attorney, Agent, or Firm* — Gary C Cohn PLLC

(57) ABSTRACT

Triethylboron is a useful precursor for depositing films in an atomic layer deposition process. This precursor is useful for depositing boron containing films. Boron containing films are excellent lubricating coatings for zinc powders, improving their flow properties and simplifying powder handling. This makes the coated zinc powders especially useful for battery applications in which a zinc powder is used as an anode material.

4 Claims, No Drawings

ZINC ANODE BATTERY WITH BORON NITRIDE COATED ZINC PARTICLES

This application claims priority from U.S. Provisional Patent Application No. 61/347,572, filed 24 May 2010.

This invention relates to atomic layer deposition processes for depositing boron-containing films. It also relates to zinc metal particles coated with boron-containing films, and to batteries that contain such coated zinc particles as the anode material.

Zinc batteries are commonly available. They come in several varieties, including the alkaline types, which usually have a gelled strong alkali solution as a main component of the electrolyte. Particles of zinc metal or a zinc alloy form the anode material. The cathode may be a material like magnesium dioxide or atmospheric oxygen.

There are practical problems that attend the manufacture of zinc batteries. Some of these have to do with handling the zinc particles and dispersing the zinc particles into the electrolyte solution. The zinc particles tend to stick together, especially upon storage, and therefore flow poorly. This makes the mixing step and the step of filling the battery casing difficult. A way to improve the lubricity of the particles is needed, but this must be accomplished without unduly interfering with the performance of the battery.

This invention is in one aspect a process for applying a boron-containing film onto a substrate, comprising exposing the substrate to triethylboron in the vapor phase at a temperature of no greater from 100 to 600° C. such that the boron atom of the triethylboron forms a bond to the substrate surface.

The boron-containing film may contain no carbon or varying amounts of carbon, depending on reaction conditions that are employed. In general, higher temperatures, longer reaction times and the subsequent contact of the coated substrate with a second vapor phase reactant (such as ammonia, for example), all favor the removal of carbon from the film.

In specific embodiments, the invention is an atomic layer deposition process for applying a boron-containing film onto a substrate, comprising alternatively and sequentially exposing the substrate to a vapor phase boron-containing precursor and a second vapor phase reactant which reacts with the boron-containing precursor but which does not react with itself under the conditions of the atomic layer deposition process, wherein the boron-containing precursor is triethylboron.

In a particular embodiment, the invention is an atomic layer deposition process for applying a boron nitride film onto a substrate, comprising alternatively and sequentially exposing the substrate to triethylboron and ammonia in the vapor phase at a temperature of no greater than 200° C.

The invention is also zinc metal or zinc metal alloy particles having a surface boron-containing coating having a thickness of up to 10 nm, more preferably up to 2 nm. The boron-containing coating may also contain carbon in varying amounts, or may contain boron nitride. The film may contain both boron nitride and varying amounts of carbon.

The invention is also a method for producing zinc metal or zinc alloy particles coated with a boron-containing film, exposing the zinc metal or zinc alloy particles to triethylboron in the vapor phase at a temperature of no greater from 100 to 600° C. such that the boron atom of the triethylboron forms a bond to the surface of the zinc metal or zinc alloy particles.

In a particular embodiment, the method for producing zinc metal or zinc alloy particles comprises performing one or more atomic layer deposition reaction cycles in the presence of the zinc metal or zinc alloy particles, wherein in each atomic layer deposition cycle the zinc metal or zinc alloy particles are exposed alternatively and sequentially to vapor phase triethylboron and vapor phase ammonia. In preferred cases, from 1 to 5 or from 1 to 3 of such reaction cycles may be performed.

Zinc particles coated in accordance with the invention may be used to form the anode of a zinc anode battery in which the coated zinc particles are dispersed in an alkaline electrolyte, and the battery also comprises a cathode and a separator interposed between the zinc particles and the cathode.

In simple embodiments of the invention, the substrate is exposed to a single dose of vapor phase triethylboron. The reaction conditions are selected so that the triethylboron is in the vapor phase. The temperature is suitably from 100 to 600° C., preferably at least 150° C. The pressure is generally subatmospheric, in order to maintain the triethylboron in the vapor stage and to prevent the triethylboron from condensing within the reactor.

During this contacting step, the triethylboron reacts with functional groups on the surface of the substrate, releasing ethane as a reaction by-product. Some of the ethyl groups may not react, leaving the resulting coating with some carbon content. Higher temperatures and longer reaction times favor more complete removal of carbon.

A single-step coating reaction in accordance with this aspect of the invention is believed to deposit essentially a mono-atomic layer of boron onto the surface of the substrate.

In an atomic layer deposition process in accordance with the invention, a boron-containing film is applied to the substrate by introducing two or more gas phase reactants separately and alternatingly into the deposition chamber. One of the gas phase reactants is triethylboron. The reactants are not capable of reacting with themselves under the conditions of the process. Each reactant reacts at the surface of the substrate, each in turn forming a mono-layer of deposited material. Excess amounts of reactant are removed from the reaction zone before introducing the next reactant. Reaction by-products are removed as well, between successive introductions of the reagents. This procedure ensures that reactions occur at the surface of the substrate, rather than in the gas phase.

A purge gas is typically introduced between the alternating feeds of the reactants, in order to further help to remove excess reactants. A carrier gas, which is usually but not necessarily the same as the purge gas, generally (but not always necessarily), is introduced during the time each reactant is introduced. The carrier gas may perform several functions, including (1) facilitating the removal of excess reactant and reaction by-products, (2) distributing the reactant through the reaction zone, thereby helping to expose all substrate surfaces to the reactant and (3) in the case of applying the coating to the electrode particles, fluidizing a particulate substrate so that all particle surfaces become exposed to the reactant. The purge gas does not react undesirably with the ALD reactants or the deposited coating, or interfere with their reaction with each other at the surface of the metal particles.

A typical pattern of introducing reactants (in a two-reagent ALD reaction scheme) is:

1. Optionally, introduce purge/fluidizing gas.
2. Introduce the first reagent or a mixture of carrier gas and the first reagent.
3. Introduce purge/fluidizing gas and/or pull a high vacuum to remove excess quantities of the first reagent as well as reaction by-products.
4. Introduce the second reagent or a mixture of carrier gas and the second reagent.

5. Introduce purge/fluidizing gas and/or pull a high vacuum to remove excess quantities of the second reagent and reaction by-products.

6. Repeat steps 2-5 until desired the coating thickness is obtained. This process is adaptable to include any number of reagents within a single reaction cycle.

Reaction conditions are selected mainly to meet two criteria. The first criterion is that the reagents are gaseous under the conditions of the reaction. Therefore, temperature and pressure conditions are selected such that the reactants are volatilized. The second criterion is one of reactivity. Conditions, particularly temperature, are selected such that the desired reaction between the film-forming reagents (or, at the start of the reaction, the first-introduced reagent and the particle surface) occurs at a commercially reasonable rate.

In this invention, one of the reactants is triethylboron, which acts as a source of boron atoms for the applied film. The other reactant is most preferably ammonia, in which case a boron nitride film is applied to the substrate. The boron nitride film may contain various amounts of carbon which may be present due to the incomplete reaction of all the ethyl groups on the triethylboron.

The temperature of the reactions may range from 250-1000K, but is preferably no greater than 200° C. A preferred temperature range is from 150 to 200° C. The substrate should be thermally stable at the temperatures used to deposit the film; hence, in some cases the operating temperature may be selected in conjunction with the particular substrate.

Subatmospheric pressures will normally be required.

The progress of the reaction can be monitored using techniques such as transmission. Fourier transform infrared techniques, Auger electron spectroscopy, and mass spectrometry.

Such atomic layer deposition techniques permit the formation of deposits of up to about 0.3 nm in thickness per reaction cycle, and thus provide a means of extremely fine control over deposit thickness. The reactions are self-limited and can be repeated to sequentially deposit additional layers of the deposited material until a desired thickness is achieved. During the first reaction cycle, the first reagent will react with functional groups on the electrode to form a covalent bond to the substrate. Subsequent reaction cycles build the coating onto the substrate.

Deposition occurs on at least the exposed external surfaces of the substrate. In some cases, some diffusion of the reactant into the substrate may occur during the deposition process. This may be due to the vapor phase reactants entering into voids or pores that exist in the substrate material.

Particles are coated in an ALD process in such a manner that the vapor phase reactants can flow easily between particles and make contact with the particle surfaces. This can be done by fluidizing a bed of the particles of electrode material, or by contacting the particles with the vapor phase reactants in a rotating tube or similar vessel. Methods for applying ALD coatings onto particles are described, for example in U.S. Pat. No. 6,913,827. A semicontinuous reactor as described in Example 3 below is also useful.

Enough ALD reaction cycles are performed to provide a coating of the desired thickness. As few as one ALD reaction cycle may be performed, in which case the applied coating will typically be less than 1 nm thick. A coating may be as thick as 100 nanometers or even more can be applied, through continued repetitions of the ALD reaction cycle. In many cases a coating thickness of from 2 angstroms to 20 nm is preferred and a coating thickness of from 2 angstroms to 5 nm is more preferred.

An alternative way of expressing coating thickness is through the number of ALD reaction cycles that are performed. Generally, at least two ALD reaction cycles are performed. Up to 50 or more cycles can be performed, but for many applications it is preferred to conduct up to 20 cycles, and more preferred to conduct up to about 10 cycles or up to about 7 cycles.

A substrate of interest is zinc particles, which can be pure zinc metal particles or some alloy that contains some other elements, as may be suitable in battery anode applications. Zinc particles that are used for alkaline battery and zinc-air battery anodes often contain, for example a small amount of mercury which helps to reduce hydrogen gas generation. For purposes of this invention, the zinc alloy particles include any mixture of zinc and one or more other elements that is useful as an anode material. The particles may contain from 80 to 100% by weight zinc, and preferably contain from 95 to 100% by weight zinc, prior to application of the boron-containing coating.

Applicants have found that a very thin coating of a boron-containing coating can increase the lubricity of zinc metal or zinc alloy particles very significantly. The film may be no greater than 10 nm thick, and is preferably no greater than 2 nm thick. The film may be one produced by exposing the zinc particles to a single exposure of triethylboron. Alternatively, the film may be one produced in from 1 to 5, or from 1 to 3, ALD reaction cycles using triethylboron and ammonia as the vapor phase precursor materials. Because the films are so thin, they are not expected to represent a significant barrier to either electrons or ionic species, and thus are not expected to have any significant adverse affect on the performance of the battery.

Zinc particles (including the zinc metal or zinc alloy particles) coated in accordance with this invention are useful as anode materials for alkaline and zinc-air batteries.

In an alkaline battery, the coated zinc particles are mixed with a gelled, aqueous alkali solution. The alkali is typically potassium hydroxide although other strong alkalis can be used as well (or in addition). The cathode typically contains manganese oxide, which may be present in the form of a compressed paste that also includes carbon particles to increase conductivity. A porous separator, which allows the electrolyte but not the zinc particles to pass through, is interposed between the anode and cathode materials. The anode, cathode, electrolyte and separator are usually held in a can or other container, which normally is vented to allow gases to escape. Separate current collectors connect the anode and cathode to the battery terminals.

In a zinc air battery, the coated zinc particles are again mixed with the electrolyte solution, which may be gelled or ungelled, to form the anode/electrolyte mixture. This mixture is placed into a reservoir, or "can". A separator forms a barrier between the anode/electrolyte mixture and the cathode. The cathodic material is atmospheric oxygen, which is provided through air holes in the battery casing. The air is brought into contact with a cathode surface, which may include manganese oxide and optionally carbon and an insulating polymer, which are pressed onto a metal (typically nickel) screen. The manganese oxide performs a catalytic function for the half reaction $$\tfrac{1}{2}O_2 + H_2O + 2e^- \rightarrow 2OH^-$$

which occurs at the cathode.

The separator is conveniently constructed from a nonconductive material. It should not be reactive with or soluble in the electrolyte solution or any of the components of the electrolyte solution under operating conditions. Polymeric separators are generally suitable. Examples of suitable polymers for forming the separator include polyethylene, polypropylene, polybutene-1, poly-3-methylpentene, ethylene-propylene copolymers, polytetrafluoroethylene, polystyrene, polymethylmethacrylate, polydimethylsiloxane, polyethersulfones and the like.

The electrolyte solution must be able to permeate through the separator. For this reason, the separator is generally porous, being in the form of a porous sheet, nonwoven or woven fabric or the like. The porosity of the separator is generally 20% or higher, up to as high as 90%. A preferred porosity is from 30 to 75%. The pores are generally no larger than 0.5 microns, and are preferably up to 0.05 microns in their longest dimension. The separator is typically at least one micron thick, and may be up to 50 microns thick. A preferred thickness is from 5 to 30 microns.

Zinc metal and zinc alloy particles that are coated in accordance with this invention have dramatically better flow properties than uncoated zinc powders. This is the case even when the coating thickness are extremely thin, corresponding to as few as 1-3 ALD reaction cycles. This greatly facilitates the battery manufacturing process, and in particular the steps of mixing the powder with an electrolyte and battery filling operations.

The following examples are intended to illustrate the invention, but not to limit the scope thereof. All parts and percentages are by weight unless otherwise indicated.

EXAMPLE 1

Boron nitride ALD films are grown directly onto 1-5 µm and 75 µm zinc particles using a fluidized bed reactor of 2.5" diameter. The reagents are triethylboron (TEB) and ammonia. 150 g of zinc particles are charged into the reactor, and the reactor is sealed for operation under vacuum. TEB is dosed into the reactor for 30 s at an operating pressure of approximately 5 Torr, under continuous flow conditions. The reactor is then purged at the same pressure with nitrogen for five minutes. Ammonia is dosed under similar conditions for three minutes, and then the reaction is again purged with similarly using nitrogen. These steps constitute one ALD cycle. The deposition is performed at 175° C. Two ALD cycles are performed on the zinc particles. The approximate coating thickness is 0.2 nm.

Particles made in accordance with Example 1 are tested for their flow characteristics when dispersed in a highly-loaded alkaline slurry using a rotary vane rheometer. For comparison, the flow characteristics of the starting (uncoated) zinc particles are also tested.

Values obtained in such testing are as reported in Table 1 below.

TABLE 1

| | Uncoated Zn | | 2 ALD cycles on Zn | | |
|---|---|---|---|---|---|
| Shear (1/s) | Viscosity (cP) | STD | Viscosity (cP) | STD | Improvement due to coating |
| 1.12 | 6426.67 | 508.46 | 5693.33 | 367.74 | 11% |
| 1.40 | 6293.33 | 376.34 | 5496.67 | 230.29 | 13% |
| 1.68 | 6000.00 | 187.35 | 5146.67 | 195.53 | 14% |
| 2.80 | 5610.00 | 226.05 | 4073.33 | 120.97 | 27% |
| 3.36 | 5100.00 | 257.10 | 3773.33 | 269.51 | 26% |
| 5.60 | 4383.33 | 730.37 | 3023.33 | 389.91 | 31% |

The lower viscosity of a highly-loaded slurry is shown over a range of shear rates. The reduction in slurry viscosity due to the coatings ranges between 11-31%, depending on shear rate. This demonstrates that the coatings are stable in the strong alkaline solution, and that they provide enhanced lubrication when in a wet slurry/paste form.

EXAMPLE 2

Boron nitride ALD films are grown directly onto 1-5 µm and 75 µm zinc particles using a fluidized bed reactor of 6" diameter. The reagents are triethylboron (TEB) and ammonia. 3 kg of zinc particles are charged into the reactor, and the reactor is sealed for operation under vacuum. TEB is dosed into the reactor for three minutes at an operating pressure of approximately 5 Torr, under continuous flow conditions. The reactor is then purged at the same pressure with nitrogen for ten minutes. Ammonia is dosed under similar conditions for five minutes, and then the reaction is again purged with similarly using nitrogen. These steps constitute one ALD cycle. The deposition is performed at 175° C. Two ALD cycles are performed on the zinc particles. The approximate coating thickness is 0.2 nm.

Particles made in accordance with Example 2 are tested for their flow characteristics using a Freeman FT4 powder rheometer. For comparison, the flow characteristics of the starting (uncoated) zinc particles are also tested.

Values obtained in such testing are as reported in Table 2 below. Definitions of terms are available from freeemantech.co.uk.

TABLE 2

| Property | Uncoated Particles | Uncoated zinc particles (Ex. 2) |
|---|---|---|
| Basic Flowability Energy, mJ | 2017 | 2148 |
| Stability Index | 1.30 | 1.22 |
| Flow Rate Index | 1.99 | 2.14 |
| Specific Energy, mJ/g | 4.91 | 4.34 |
| Conditioned Bulk Density g/cc | 3.14 | 3.52 |
| Aerated Energy, mJ | 166 | 13.8 |
| Aeration Ratio | 13.1 | 165 |
| Normalized Aeration Sensitivity (s/mm) | 0.84 | 0.96 |
| Pressure Drop (mbar) | 49.9 | 73.9 |
| Permeability, $k_{15}$ (X$10^9$ cm) | 0.63 | 0.44 |
| Compressibility, % | 12.0 | 8.2 |
| Shear Stress, $\tau_{7.9}$ kPa | 4.41 | 3.98 |
| Shear Stress, $\tau_{3.9}$ kPa | 2.35 | 1.92 |
| Cohesion, kPa | 0.83 | 0.40 |
| Unconfined Yield Strength (kPa) | 2.7 | 1.3 |
| Flow Function | 5.2 | 10.3 |

The lower specific energy of Example 2 indicates that it flows more easily in a low stress, conditioned state such as exists during a powder conveying operation. The coated powder of Example 2 also fluidizes more easily. The higher aeration ratio of Example 2 indicates that it will perform better in a gravity feed system and in processes such as volumetric filling.

Example 2 has lower compressibility and cohesion and higher conditioned bulk density, all of which indicate less sticking between particles and that the powder is less likely to consolidate during storage and transportation.

The lower shear strength and higher flow function of Example 2 indicate that the powder will be less difficult to flow through a hopper.

EXAMPLE 3

Boron-containing films are grown directly onto 1-5 µm and 75 µm zinc particles using a semi-continuous flow reactor.

The reactor configuration consists of a 3" diameter vertical tube with a height of 48", with reducing unions on either end to reduce the inlet and outlet to 1.5" diameter sections. The inlet and outlet are sealed by 1.5" vacuum-compliant knife gate valves at the top and bottom. The top valve separates the powder (above) from the reactor chamber (below). The bottom valve separates the reactor chamber (above) from the next processing step. 150 g of zinc particles are charged into the chamber above the top knife gate valve, and allowed to rest on the gate itself, and the chambers of the reactor are sealed for operation under vacuum. The reagent is triethylboron (TEB).

The bottom knife gate valve is then opened to allow TEB to be charged into the reactor chamber, which is pre-heated to the operating temperature of 175° C. The bottom knife gate valve is subsequently closed, followed by the top knife gate being opened, allowing the powder to fall through the TEB vapor and be contacted by the gases on the surfaces of the particles. After the powder falls through the precursor vapor, and any unreacted TEB and the reaction product, ethane, are removed by vacuum, the top gate valve is closed and the bottom gate valve is opened, allowing the coated powder to fall out of the reactor. The performance of this powder on testing for flow characteristics is nearly identical to the powder produced in Example 2, even though ammonia is not applied in this case.

EXAMPLE 4

Boron nitride ALD films are grown directly onto 1-5 μm and 75 μm zinc particles using a semi-continuous flow reactor described in Example 3. 150 g of zinc particles are charged into the chamber above the top knife gate valve, and allowed to rest on the gate itself, and the chambers of the reactor are sealed for operation under vacuum. The reagents are triethylboron (TEB) and ammonia. The process procedure and operating conditions are identical to those described in Example 3. Once the powder has been reacted with TEB and is allowed to fall through the lower gate valve, it is unloaded and re-charged into the top of the reactor chamber. An identical process is carried out using ammonia as the second reactant, thus completing the ALD reaction cycle. A second ALD cycle is performed in the same manner. The lubricating effect of the coating is essentially identical to that of the powder produced in Example 2.

Similar results are obtained when the unloading and reloading process is automated.

The invention claimed is:

1. A zinc anode battery comprising zinc particles dispersed in an alkaline electrolyte, a cathode and a separator interposed between the zinc particles and the cathode, wherein the zinc particles have a surface boron nitride coating of up to 10 nm in thickness.

2. The zinc anode battery of claim 1 wherein the boron nitride coating is up to 2 nm in thickness.

3. The zinc anode battery of claim 1 wherein the cathode includes manganese dioxide.

4. The zinc anode battery of claim 1 wherein the cathode is air.

* * * * *